United States Patent
Ohtsu et al.

(10) Patent No.: US 6,793,980 B2
(45) Date of Patent: Sep. 21, 2004

(54) METHOD OF FORMING PHOTO-CATALYTIC FILM MADE OF TITANIUM OXIDE ON BASE MATERIAL AND LAMINATED MATERIAL THEREOF

(75) Inventors: Shigemi Ohtsu, Nakai-machi (JP); Eiichi Akutsu, Nakai-machi (JP)

(73) Assignee: Fuji Xerox Co., Ltd., Tokyo (JP)

(*) Notice: Subject to any disclaimer, the term of this patent is extended or adjusted under 35 U.S.C. 154(b) by 237 days.

(21) Appl. No.: 10/013,390

(22) Filed: Dec. 13, 2001

(65) Prior Publication Data

US 2003/0003304 A1 Jan. 2, 2003

(30) Foreign Application Priority Data

Jun. 28, 2001 (JP) ........................... 2001-196562

(51) Int. Cl.[7] ............... B05D 3/06; H01L 21/203; H01L 21/205
(52) U.S. Cl. .............. 427/558; 427/559; 427/586; 427/350; 427/372.2; 438/308; 438/486; 438/487; 438/795; 438/798
(58) Field of Search ............... 427/350, 372.2, 427/558, 559, 586, 109, 126.3, 160, 294; 438/308, 486, 487, 795, 798; 428/412

(56) References Cited

U.S. PATENT DOCUMENTS 5,579,162 A * 11/1996 Bjornard et al. ............ 359/580
6,236,061 B1 * 5/2001 Walpita ...................... 257/40
2002/0132454 A1 * 9/2002 Ohtsu et al. ................ 438/486

FOREIGN PATENT DOCUMENTS

| JP | 5-315361 A | 11/1993 |
| JP | 5-326402 A | 12/1993 |
| JP | 6-11738 A | 1/1994 |
| JP | 2000-68520 A | 3/2000 |

OTHER PUBLICATIONS

Copending Application 10/013,371.*

* cited by examiner

Primary Examiner—James J. Seidleck
Assistant Examiner—Thao Tran
(74) Attorney, Agent, or Firm—Oliff & Berridge, PLC

(57) ABSTRACT

A method of forming a photo-catalytic film made of titanium oxide on a base material based on a simple process at low temperatures, particularly a method of forming a laminated material comprising photo-catalytic film of titanium oxide formed on a base material is provided. A method of forming a photo-catalytic film made of titanium oxide on a base material includes a treating process, in which photo-catalytic film of titanium oxide is formed on a base material and irradiated with UV light in vacuum or in an atmosphere of reducing gas at a temperature maintained between 25° C. and below 300° C.

19 Claims, 2 Drawing Sheets

METHOD OF FORMING PHOTO-CATALYTIC FILM MADE OF TITANIUM OXIDE ON BASE MATERIAL AND LAMINATED MATERIAL THEREOF

BACKGROUND OF THE INVENTION

1. Field of the Invention

The present invention relates to a method of forming a photo-catalytic film made of titanium oxide which has photo-catalytic activities such as anti-bacteria, anti-pollution, air-cleaning, or hyper hydrophilic property, on a base material and a laminated material including a base on which a photo-catalytic film of titanium oxide is formed. More particularly, it relates to a laminated material including a flexible transparent base on which a photo-catalytic film of titanium oxide is formed.

2. Description of the Related Art

The photo-catalytic activity, the photo-catalyst possessing photo-voltaic force, and the optical semiconductor are a recent focus of attention for their extraordinary application. For example, titanium oxide, which is a photo-catalyst (optical semiconductor), is reported to decompose by oxidation organic stains stuck on a material surface, nitrogen oxides ($NO_x$), sulfur oxides ($SO_x$), air-contaminating substances such as odor sources or bacteria, depending on its oxidizing power based on the photo-catalytic activity. The known embodiments include a method of removing air-contaminating substances with sunlight based on a photo-catalytic catalyst of titanium oxide that is pasted on a building wall (Japanese Published Unexamined Patent Application No. Hei 06-315614), a method of sterilizing bacteria based on a titanium oxide catalyst that is pasted on a wall or a handrail in a hospital (Japanese Published Unexamined Patent Application No. Hei 07-102678), a method of decomposing stains in wastewater based on a titanium oxide catalyst dispersed in the wastewater under the irradiation of light from a UV lamp (Japanese Published Unexamined Patent Application No. Hei 05-92192), a method of applying the self-cleaning action of a photo-catalyst to simplifying the maintenance of a fluorescent lamp or a lighting appliance (Japanese Published Unexamined Patent Application No. Hei 09-129012), and many other applications.

It is reported that the surface of photo-catalytic film becomes highly hydrophilic due to the photo-catalytic reaction. Its application has been widely investigated for prevention of clouding in mirrors (of bathroom or automobile), lenses or windows.

Further, the self-cleaning action of the photo-catalytic coating is well known. In more detail, the photo-catalytic coating formed on building walls, automobile glass, or house windows works to prevent sticking of hydrophobic stains due to its hydrophilic property on the processed surface. Even when some stains are stuck, they are easily decomposed. The hydrophilic property of the coating effects to wash out easily these stains and their decomposition products by rain or water flushing.

The photo-catalytic coating of titanium oxide may be obtained by various production methods. They include a method of applying a hydrolysis product of titanium compounds such as titanium alkoxide or titanium acetate on a base material followed by drying and sintering at more than 500° C. to yield a coating of anatase-type titanium oxide, a method of forming amorphous titanium oxide coating on a base by the deposition method followed by annealing at more than 400° C. to yield a coating containing anatase-type titanium oxide, a method of oxidizing a surface of metallic titanium at more than 500° C. and inducing crystallization, and a method of employing the RF sputtering, which is applied on a base material heated at more than 250° C. to yield a coating of anatase-type titanium oxide.

Among these methods, the calcination of a coating of amorphous titanium oxide for the photo-catalytic coating requires heating of the base material at a very high temperature for a long time, which leads economically to a high cost. In addition, formation of a photo-catalytic coating on a plastic resin base is practically impossible in view of the heat resistance of the plastic resin base. The RF sputtering method is an excellent technique for production of anatase-type titanium oxide that yields a large photocurrent. But it requires an expensive production apparatus and is difficult to produce photo-catalytic coating at a low cost. Although some plastic base materials endure the high temperature of 250° C., there is no plastic base materials that is equipped with excellent light transmission, heat resistance above 250° C., and reasonable production cost simultaneously.

The photo-catalytic coating has lately attracted considerable attention for its photo-voltaic force as well as novel characteristics such as anti-pollution, anti-bacteria, and anti-clouding based on the photochemical reaction on the surface. When a base equipped with a conductive film and a photo-catalytic film is immersed in an aqueous solution or an electrolytic solution under UV light applied on the photo-catalytic film, the photo-voltaic force is generated on the irradiated section. Selective formation of a photo-catalytic film becomes possible using the phenomenon. In more detail, when the above-mentioned base is immersed in an electro-depositing solution containing electro-deposition substances that induce film formation, with or without a bias voltage applied between the conductive film and an opposed electrode, under irradiation on the photo-catalytic film with UV light, the photo-voltaic force is generated on the irradiated section resulting in the electro-deposition of film forming substances on the section. In the case of sufficiently high photo-voltaic force for the photo-catalytic film, the bias voltage may be omitted.

The inventors of the present invention have previously applied for a method of forming extra-fine patterns with excellent resolution using the above-mentioned photo-voltaic force, which may be useful for production of color filters and the like (Japanese Published Unexamined Patent Application Nos. Hei 11-74790, Hei 11-133224, and Hei 11-335894).

With regard to the method of forming semiconductor film on a plastic resin base, Japanese Published Unexamined Patent Application No. Hei 06-11738 describes formation of a crystalline semiconductor film of silicon for an MIM apparatus, in which a film surface of insulating base compound made of silicon is irradiated with energy beam such as laser beam causing meltdown of the surface and converting the surface layer into a film of crystalline silicon. Under the surface layer the insulating base compound layer remains unchanged. Also, Japanese Published Unexamined Patent Application No. Hei 05-315361 describes formation of a semiconductor film on a plastic film, in which a film of non-crystalline substance and an insulating film of metal oxide are formed on a plastic film in this order, followed by application of laser beam on the side of the insulating film causing meltdown of the film of non-crystalline substance near the interface between the non-crystalline film and the insulating film for subsequent crystallization. This method yields a crystalline semiconductor film without giving thermal damages on the plastic film due to laser beam. Further, Japanese Published Unexamined Patent Application No. Hei 05-326402 describes a similar method, in which a heat barrier film and then a film of amorphous silicon are formed on a plastic film to eliminate the thermal effect by laser beam, followed by application of laser beam to induce formation of a polycrystalline silicon film.

All these methods are dependent on crystallization of amorphous semiconductor film by annealing with laser beam. In order to eliminate the thermal effect by laser beam (it sometimes reaches 1,000° C.) on the plastic film, one method employs meltdown of only the surface layer of the amorphous semiconductor film, and the other opts for additional formation of a heat barrier layer. With these methods it is impossible to induce crystallization of the whole amorphous film, requiring an additional process providing of a heat barrier layer as well as an expensive laser beam irradiation apparatus. In addition, it becomes difficult to obtain a large-sized film, as the whole surface of the film has to be scanned with the spot of laser beam. They are also disadvantageous because the total crystallization needs much time for completion.

Japanese Published Unexamined Patent Application No. 2000-68520 describes application of UV laser beam of a short wavelength (excimer laser beam) to convert a film of amorphous silicon into semiconductor film of crystalline silicon. This method does not give much thermal effect on the base material, yet the temperature of the base material reaches around 600° C. For this reason only glass bases are employed in the invention.

SUMMARY OF THE INVENTION

The present invention has been contrived in view of the above problems. The present invention provides a method of forming a photo-catalytic film of titanium oxide on a base material at low temperatures depending on simple processes and a laminated material including a photo-catalytic film of titanium oxide formed on a base material.

Hereinafter, embodiments of the present invention will be described with reference to the accompanying drawings.

The present invention also provides a method of forming a photo-catalytic film made of titanium oxide on a base material comprising a process of UV light irradiation on the film in vacuum or in an atmosphere of reducing gas at a temperature maintained between 25 and 300° C.

The film of titanium oxide before the irradiation may be a film of amorphous titanium oxide, and the produced photo-catalytic film of titanium oxide may be a film of anatase-type titanium oxide.

The photo-catalytic film of titanium oxide may be a photo-catalytic film of titanium oxide having oxygen deficiencies.

The UV light may be applied with an excimer lamp.

The maintained temperature may range between 50 and 250° C.

The base material may be made of plastic, and the maintained temperature ranges between 50° C. and a heat resistant temperature of the plastic base material.

The heat resistant temperature of the plastic base material may range between 100 and 230° C.

The film of amorphous titanium oxide may be formed by a sputtering method.

The film of amorphous titanium oxide may be formed by an electron beam deposition method.

An anti-reflection film may be set up between the base material and the film of titanium oxide.

The anti-reflection film may be a mono-layer, its refractive index may be a figure between a refractive index of the base material and a refractive index of the photo-catalytic film of titanium oxide, and an optical thickness of the photo-catalytic film, which is defined as a product of the refractive index of the photo-catalytic film times its thickness, may correspond to one-fourth of a central wavelength of visible light, or an integer multiple of one-fourth of a central wavelength of visible light.

The anti-reflection film may be a multi-layer, and its refractive index figures for respective films range between the refractive index of the base material and the refractive index of the photo-catalytic film of titanium oxide, and optical thickness values of the respective anti-reflection film, which are defined as a product of the respective refractive index of each anti-reflection film times its thickness, may correspond to one-fourth of a central wavelength of visible light, or an integer multiple of one-fourth of a central wavelength of visible light.

The refractive index of the anti-reflection film may be between 1.5 and 2.3.

The anti-reflection film may be made of metal oxide.

The anti-reflection film may be made of zirconium oxide.

The anti-reflection film may be made of indium tin oxide (ITO).

The anti-reflection film may be between 50 nm and 100 nm.

This invention also provides a method of forming a photo-catalytic film of titanium oxide, wherein an optical thickness of the photo-catalytic film, which is defined as a product of a refractive index by the film thickness, corresponds to one-half or its integer multiples of a wavelength of light that is near a center of a visible region.

The thickness of the film may be between 70 nm and 150 nm.

The present invention also provides a laminated material including at least a base material, an anti-reflection film, and a photo-catalytic film of titanium oxide arranged in this order.

The present invention also provides a laminated material including at least a base material and a photo-catalytic film of titanium oxide having a thickness between 50 nm and 2.0 µm.

The present invention also provides a laminated material, wherein the base material is a light-transmitting flexible base material made of plastic.

The optical thickness of the photo-catalytic film, which is defined as a product of the refractive index of the photo-catalytic film times its thickness, may correspond to one-half of a central wavelength of visible light, or an integer multiple of one-half of a central wavelength of visible light.

The present invention also provides a flexible photo-catalytic sheet making up a plastic base, an anti-reflection film, and a film of crystalline titanium oxide arranged in this order.

The present invention also provides a flexible photo-catalytic sheet, wherein the sheet is substantially light-transmitting.

The present invention also provides a flexible photo-catalytic sheet making up a plastic base material and a film of anatase-type titanium oxide arranged in this order.

BRIEF DESCRIPTION OF THE DRAWINGS

Preferred embodiments of the present invention will be described in detail based on the followings, wherein.

DETAILED DESCRIPTION OF PREFERRED EMBODIMENTS

Figure 1:
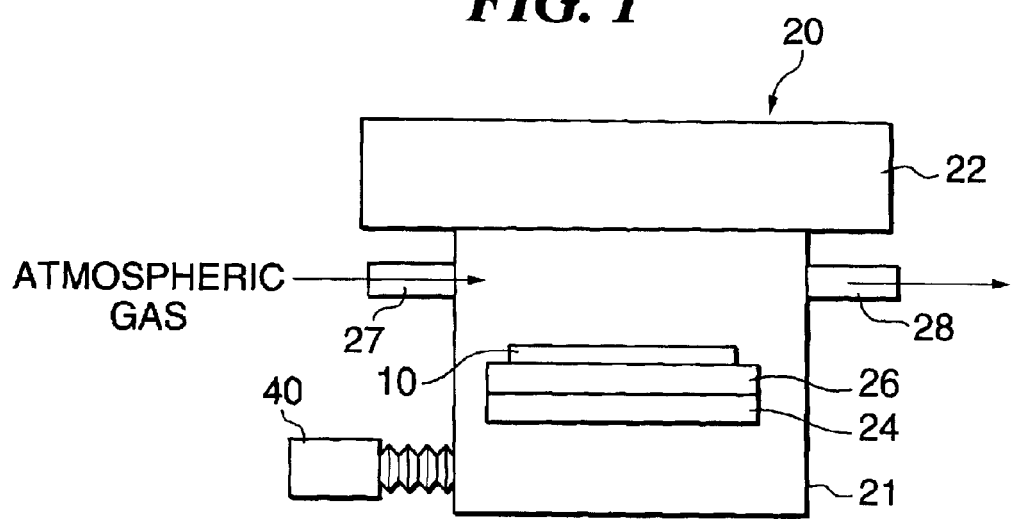
FIG. 1 is a schematic diagram for an example of annealing apparatus employed in the present invention.

The production method of photo-catalytic film made of titanium oxide according to the present invention is characterized by the application of UV light on the film at rather low temperatures. Compared with a previous method where the film of titanium oxide is irradiated with laser beam at high temperatures around 1,000° C. for obtaining film of crystalline titanium oxide by annealing, this method is applicable at very low temperatures for the annealing. In addition, scanning of a laser beam spot is not necessary in this method, and only application of UV light on the whole surface of a film using UV light irradiation apparatus is needed. For the reason, it is possible to produce a photo-catalytic film of titanium oxide in a shorter time without a large-scale treatment apparatus compared with the existing methods. As a result, the production cost can be substantially reduced.

While in the existing methods a complicated process or an apparatus is needed in order to form a photo-catalytic film on a plastic resin base as described in the above, the present invention allows to form a photo-catalytic film on a plastic base material with a simple process or an apparatus.

Also in a complicated process according to the existing methods for applying anti-clouding, anti-pollution, or hydrophilic treatment on a mirror or a glass surface, an amorphous photo-catalytic film is first to be formed on the surface followed by sintering at more than 400° C. In contrast, the method according to the present invention allows easy production of a photo-catalytic film on a plastic base material. Pasting such a processed base on a surface that needs anti-clouding, anti-pollution or hydrophilic property leads most simply to the wanted properties of the surface.

Concerning the base material used in the present invention, limitlessly employed are glass base materials; base materials made of plastic resins in the form of film, sheet, or plate; ceramic base materials such as ceramic sheet or ceramic plate; and mono-crystalline bases made of Si, GaN, GaAs, or GaP. As the base materials of plastic, listed are films, sheets, or plates of polyethylene terephthalate, polyethylene naphthalate, polyetherether-ketone, polyether-sulfone, polysulfone, polyether-imide, polyetherketone, polyphenylene-sulfide, polyarylate, polyimide, polycarbonate, and norbornene resin (trade name; ARTON by JSR). These plastic base materials should preferably have a flexible character. Among these resins norbornene resin is a recent focus of attention as an excellent heat resistant resin having superior transmissivity of light in a wide range of spectrum (Chemical Business Journal, December 1997 extra edition).

When the base processed of photo-catalytic film according to the present invention is employed practically for the anti-clouding or anti-pollution of substances that have a property of light reflection or light transmission, the base material should also have a light-transmitting property.

Since a rather high heating temperature is favored for the film of titanium oxide to yield a film having an excellent photo-catalytic effect, adoption of highly heat resistant plastic base materials is preferable when plastic base materials are used. Typical heat resistant plastic base materials include polyimide (heat resistant temperature of 331° C.), polycarbonate (PC: heat resistant temperature of 205° C.), polyether-sulfone (PES: heat resistant temperature of 223° C.), polysulfone (PS: heat resistant temperature of 190° C.), and norbornene resin (ARTON: heat resistant temperature of 171° C.). Particularly the heat resistant type PC and PES are favored because of their high transparency, heat resistance around 220° C., and less optical anisotropy. In the present invention, the heat resistant temperature of the plastic base material is a glass transition point, which is 10 to 230° C.

When plastic resins are employed as the base, the thickness should be preferably 30 to 300 μm, more preferably 80 to 230 μm.

The property "amorphous" described in the present invention means not only the film of completely amorphous titanium oxide, but also a mixture film of amorphous and crystalline titanium oxide. Processing according to the present invention on a film of titanium oxide that contains only a trace of amorphous section has proved to enhance the photo-catalytic effect.

Concerning the formation method of film of amorphous titanium oxide in the present invention, there are the sputtering method, the RF sputtering method, the EB deposition method, and the ion plating method.

In the case where a film of amorphous titanium oxide is formed on a plastic base material, many transparent plastics having comparatively low heat resistance (below 230° C.) may be used. The sputtering method and the RF sputtering method are favored for the film formation because they give damages less to the base material.

The heating temperature for film of amorphous titanium oxide in the present invention is preferably above 25° C., more preferably above 50° C., which suffices for converting the amorphous state into a crystalline or polycrystalline state yielding a film of titanium oxide that has an excellent photo-catalytic effect. Higher heating temperatures are favored in order to raise the crystallinity of titanium oxide. There are no particular limitations on the upper limit temperature of heating, but it is preferably approximately 300° C., more preferably approximately 250° C. in view of the selected heating method, control of the heating temperature, and the resulting energy loss. In order to raise the crystallinity effectively and determine the heating condition to an adequate value, the film of amorphous titanium oxide is heated preferably at a temperature between approximately 100 and 1200° C.

When a plastic base material is employed for the base material, the upper limit on the heating is equal to the heat resistant temperature of the plastic base material. Concerning the listed plastic base materials, it is 230° C. at most. From the above-mentioned requirement, the heating temperature for the plastic base material is preferably between approximately 100 and 200° C. (in the case the heat resistant temperature of employed plastic base material is 200° C. or lower, the upper limit is the heat resistant temperature).

The application of UV light can be satisfactorily performed with commercially available UV light irradiation apparatuses. Among them the excimer lamp is preferably employed. As a shorter wavelength of UV light has higher energy, the wavelength below 365 nm, preferably below 308 nm, is employed in the present invention (for example, UV light of 308 nm, 202 nm, and 172 nm).

An irradiation amount of 1 to 50 mW/cm$^2$ is sufficient for converting a film of titanium oxide into a photo-catalytic film. The longer the irradiation time of UV light is prolonged, the more effectively the conversion is carried out from a film of titanium oxide into a photo-catalytic film. For example, heating time of 10 to 30 minutes is adequate for the conversion at 150° C., although the heating time depends on the heating temperature.

As for the atmosphere in which the heating and the UV light irradiation are performed, vacuum or atmosphere of gases is preferred, more particularly an atmosphere having low partial pressure of oxygen is favored. Lower partial pressures of oxygen help to lower the heating temperature of film of titanium oxide. In the present invention, the "vacuum" is generally defined as a degree of vacuum below approximately $10^{-2}$ Pa. It can be determined adequately depending on other conditions. With regard to the atmosphere of gases, one or more species selected from a group including hydrogen gas, nitrogen gas, ammonia gas, rare gases such as He, Ne, or Ar, or carbon monoxide gas are preferably used. Particularly the reducing atmosphere containing hydrogen gas is preferred.

In an example, the annealing process is conducted under a reducing atmosphere of purified nitrogen gas with 2 to 5% (below the explosion limit) hydrogen gas (with a flow rate of 0.5 to 2 L/min on a 1-liter apparatus). The treated film of titanium oxide is converted from the amorphous state to a polycrystalline state while, in the process, lattice defects are generated to increase the concentration of electron carriers, which also improves the photoelectric characteristics significantly. The pressure of the reducing atmosphere may be the ordinary pressure (atmospheric pressure) or a reduced pressure.

In the formation of photo-catalytic film of titanium oxide according to the present invention, a base material having good transmission of light yields a laminated material of good light transmission. In the process, either formation of an anti-reflection film between the base material of good light transmission and the film of titanium oxide, or limitation of the optical thickness for the film of titanium oxide to a specific value, enables to suppress reflection of light between the base material having good transmission of light and the film of titanium oxide, yielding a laminated material having excellent light transmissivity.

When the anti-reflection film is a mono-layer, the following condition is preferred in order to eliminate the above reflection of light. The refractive index of the mono-layer is a figure between the refractive index of the base material and the refractive index of the photo-catalytic film of titanium oxide, and the optical thickness of the photo-catalytic film, which is defined as the product of the refractive index of the photo-catalytic film times its thickness, corresponds to one-fourth of the central wavelength of a specific employed visible light, or an integer multiple of one-fourth of the central wavelength of a specific employed visible light.

The refractive index of the anti-reflection film is preferably set between 1.5 and 2.3, and its thickness is preferably between approximately 50 nm and 100 nm.

When the anti-reflection film is a multi-layer, the following condition is preferred in order to prevent the above reflection of light effectively and improving the transmission. The refractive index figures for respective films range between the refractive index of the light-transmitting base material and the refractive index of the photo-catalytic film of titanium oxide, and the optical thickness values of the respective anti-reflection film, which are defined as the product of the respective refractive index of each anti-reflection film times its thickness, correspond to one-fourth of the central wavelength of visible light, or an integer multiple of one-fourth of the central wavelength of visible light.

The above anti-reflection film may be made from metal oxide dielectrics.

Examples of metal oxide dielectrics for the anti-reflection film include ITO, $CeF_3$, ZnS, MgO, $Gd_2O_3$, $Sc_2O_3$, $ZrO_2$, SiO, $HfO_2$, and $CeO_2$. Particularly $ZrO_2$ is widely employed for a material of dielectric film having high refractive index. The anti-reflection film made of metal oxide dielectrics can be easily formed depending on the sputtering method, the RF sputtering method, and the EB beam deposition method.

When a visible light having the central wavelength 550 nm is employed with a glass base material having a refractive index of 1.5 and a photo-catalytic film of titanium oxide having a refractive index of 2.5, it is effective to employ a material having a refractive index of 1.8 to 2.0 for the anti-reflection film. To be more precise, a film of $ZrO_2$ that has a refractive index of 2.0 with the thickness of 69 nm (550/(4×2.0)) or its integer multiples is preferred. In the case of ITO having a refractive index of 1.9, it is effective to adjust the film thickness to 72 nm (550/(4×1.9)) or its integer multiples. However, the refractive index of actual antireflection film varies greatly with its forming conditions, so the actual thickness of the film has to be determined accordingly.

As an alternative method instead of forming an anti-reflection film on a base material, it is also effective for preventing the reflection of light between the photo-catalytic film of titanium oxide and the base material to make the optical thickness of the photo-catalytic film, which is defined as the product of the refractive index of the photo-catalytic film times its thickness, correspond to one-half of the central wavelength of visible light, or an integer multiple of one-half of a central wavelength of visible light.

To take an example, when the central wavelength of a visible light is 550 nm with a photo-catalytic film of titanium oxide having a refractive index of 2.5, the thickness of the photo-catalytic film can be adjusted to 110 nm (550/(2×2.5)) or its integer multiples as a rough estimate.

Next, an explanation will be given on the experiment apparatus employed in the formation of photo-catalytic film of titanium oxide according to the present invention.

FIG. 1 illustrates a schematic diagram for an example of annealing apparatus that carries out crystallization in an atmosphere of reducing gas. Here an annealing apparatus 20 is equipped with a chamber 21 that contains a base material coated of a photo-catalytic film of titanium oxide (may be called simply "base" hereinafter), a UV light irradiation unit 22, a heating unit 24, a heat conducting plate 26 that conveys heat from the heating unit, a unit that introduces and excludes atmospheric gas that is not shown in the figure, a path 27 for introducing atmospheric gas, a path 8 for excluding atmospheric gas, and a vacuum evacuation unit 40. The number 10 denotes a base plate made of base material coated with a photo-catalytic film of titanium oxide. A temperature sensing unit is set up between the base plate 10 and the heat conducting plate 26, though not shown in the figure, and controls the temperature of the base plate (that is equal to the temperature of photo-catalytic film of titanium oxide) based on a temperature controlling unit, which is not shown in the figure. When using the annealing apparatus, the partial pressure of oxygen within the chamber is to be lowered. It is also possible to lower the partial pressure of oxygen by making a reducing gas flow in for a certain period instead of employing a vacuum evacuation unit. In this case, the vacuum evacuation unit can be omitted. Concerning the UV light irradiation unit, an excimer lamp is preferred. An electric heater is preferred for the heating unit, and a heat conducting ceramic plate may be employed for the heat conducting plate. A thermocouple may be used for the temperature sensing unit, and a turbo molecular pump may be used for the vacuum evacuation unit.

When the vacuum evacuation unit is employed, the base plate 10 is put on the heat conducting plate 26 first, and the chamber is evacuated by the vacuum evacuation unit 40 for decreasing the partial pressure of oxygen within the chamber. Then the heat conducting plate 26 is heated by the heating unit 24 to a hot state. When the temperature reaches the predetermined annealing temperature, reducing gas such as a mixture of hydrogen and nitrogen is introduced into the annealing apparatus 20. Application of UV light is started as soon as the atmosphere within the apparatus is substituted with the reducing gas.

When the production of semiconductor film is conducted in vacuum according to the present invention, the unit for introducing and excluding atmospheric gas in FIG. 1 may be replaced with a vacuum evacuation unit such as a turbo-molecular pump for removing the gas within the annealing apparatus.

The production method of semiconductor film described in the present invention affords a low temperature annealing process, and thus makes the heating unit or the temperature controlling unit of special specification unnecessary. For the purpose, an inexpensive unit may be used to a large merit.

Figure 2:
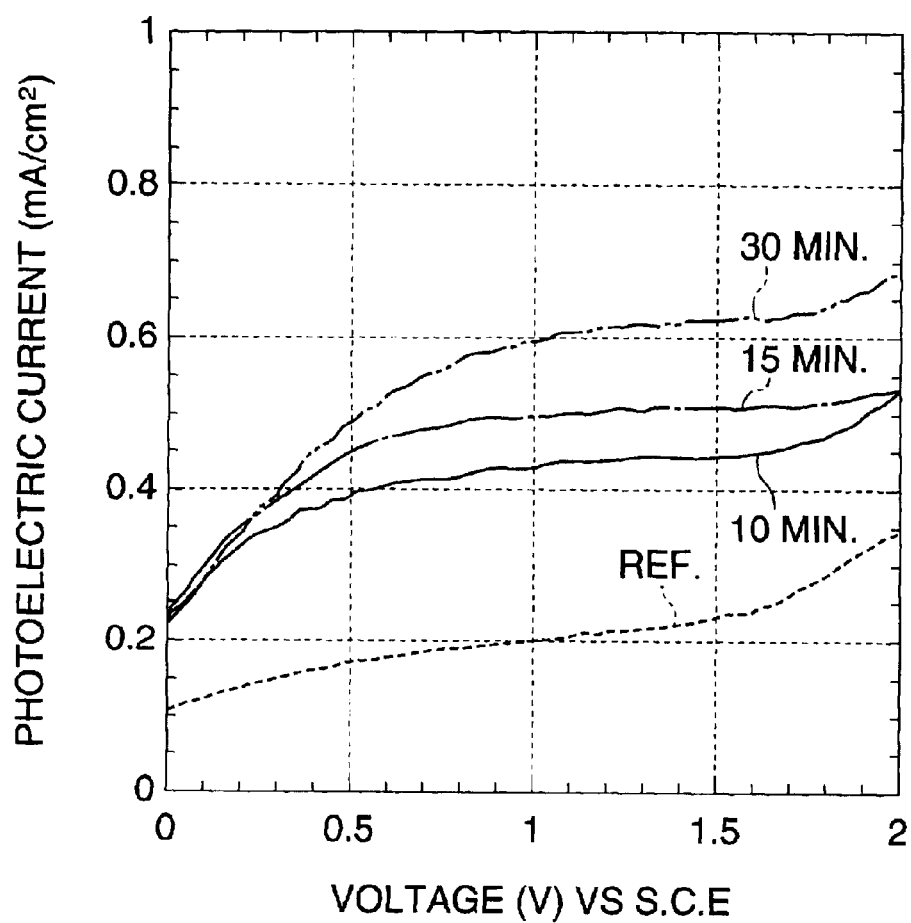
FIG. 2 is a graph for illustrating the current-voltage characteristics of amorphous film of $TiO_2$ before and after annealing.

FIG. 2 illustrates the photoelectric conversion efficiency of a photo-catalytic film of amorphous titanium oxide annealed for 10 minutes, 15 minutes, and 30 minutes with a reference before annealing. The annealing temperature was set at 125° C. (refer to EXAMPLE 1 for detailed conditions about the atmosphere and the application of light). As is clear from FIG. 2, the density of photoelectric current increased significantly after the annealing, which suggests crystallization of amorphous titanium oxide by the annealing. It is also clear that the longer annealing time caused an increase in the photoelectric current density. The obtained film was tested on an X-ray diffractometer, and an X-ray diffraction peak appeared at $2\theta=25.260$ (d=3.52 Å), which represents crystal face (1,0,1) of anatase-type titanium oxide.

The photo-catalytic film of titanium oxide obtained according to the present invention is a crystal of anatase-type or a mixed crystal of anatase-type and rutile-type.

The present invention relates to a laminated material including at least a base material and a photo-catalytic film of titanium oxide arranged in this order. When the base material is made of flexible plastic base materials, it can be wound to a roll and applied suitably to anti-pollution of building walls, etc. When the base material is made of light-transmitting plastic base materials or flexible light-transmitting base materials, the laminated material formed has the light-transmitting property and is suitable for anti-clouding and anti-pollution of mirrors and windows.

When an anti-reflection film is set up between the base material and the photo-catalytic film of titanium oxide in the above laminated material, the laminated material exhibits much improved light-transmitting property, and is particularly suitable for products that cause light reflection or transmission of light.

As an alternative method instead of forming an anti-reflection film on a base material, it is also effective for improving the transmission of light of a laminated material to make the optical thickness of the photo-catalytic film, which is defined as the product of the refractive index of the film of titanium oxide times its thickness, correspond to one-half of the central wavelength of visible light, or an integer multiple of one-half of the central wavelength of visible light.

Figure 3A:
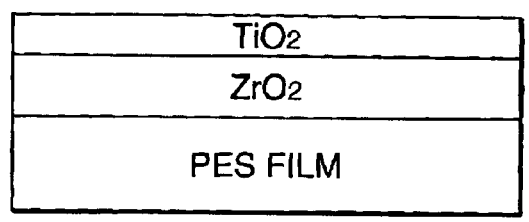
FIG. 3 is a schematic diagram for an example of layered constitution of the laminated material according to the present invention.
Figure 3B:
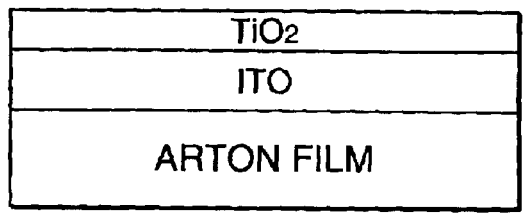
Figure 3C:
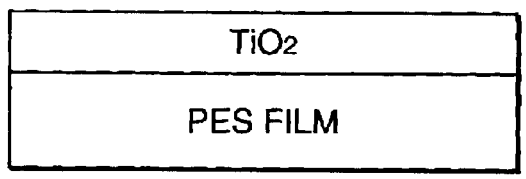
Figure 4:
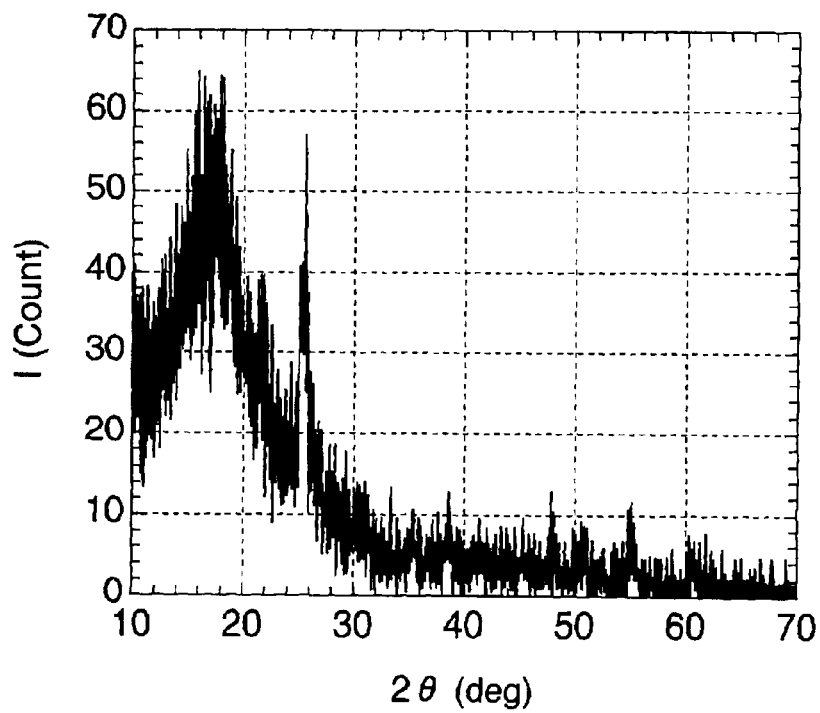
FIG. 4 is a graph for illustrating the X-ray diffraction intensity of the photo-catalytic film formed in the example 2.

FIG. 3 shows an example of a laminated material, in which a flexible plastic base material having the light-transmitting property is employed for the base. In FIG. 3A, the laminated material is made up of a PES film (125 μm thick), an anti-reflection film made of $ZrO_2$ (65 μm thick), and a photo-catalytic film of titanium oxide (200 μm thick). In FIG. 3B, the laminated material is made up of an ARTON film (188 μm thick), an anti-reflection film made of ITO (75 μm thick), and a photo-catalytic film of titanium oxide (200 μm thick). Similarly in FIG. 3C, the laminated material is made up of a PES film (150 μm thick) and a photo-catalytic film of titanium oxide (110 μm thick). Here the thickness of titanium oxide film is optimized so that the reflection of light is minimized. In these experiments, the refractive index of titanium oxide employed is 2.5.

A laminated material in total, which includes an anti-reflection film and a film of crystalline titanium oxide formed on a flexible base material, may be designed for a photo-catalytic sheet so as to function as the so-called photo-catalyst. In this case, a photo-catalytic sheet arranged or bonded on the surface of a material that needs the photo-catalytic activity can donate the photo-catalytic function to the surface. This sheet is substantially transparent against the visible light. In the case where the transparency is not strictly required, a flexible photo-catalytic sheet may be produced by forming a film of anatase-type titanium oxide directly on a plastic base material.

EXAMPLES

While the illustrative embodiments of the invention have been described with particularity, it is not intended that the scope of the claims appended hereto be limited to the examples and descriptions set forth herein.

Example 1

A 0.7-mm-thick non-alkaline glass plate (Corning No. 1737) was maintained at 180° C., on which a film of amorphous titanium oxide was formed with a thickness of 110 nm by the RF sputtering method. The processed glass plate was maintained at 150° C. in an experiment unit (about 1 liter in volume) shown in FIG. 1, which had been removed of oxygen by vacuuming ($10^{-2}$ Pa) and filled with highly purified nitrogen gas with 3% hydrogen gas. (Flow rate: 1 L/min under the atmospheric pressure). Then UV light (wavelength: 172 nm, Intensity: 10 mW/cm$^2$) was irradiated on the glass plate for 10 minutes using an excimer lamp (product of USHIO ELECTRIC INC.).

The annealed film tested on an X-ray diffractometer exhibited a diffraction peak at $2\theta=25.260$. Investigation of the contact angle revealed that it was 1.5°, confirming the highly hydrophilic property of the annealed surface.

From these results, it was established that the amorphous titanium oxide was converted into a photo-catalyst by annealing. The refractive index of the obtained photo-catalytic film of titanium oxide was 2.5.

Example 2

The example 1 was repeated except that a 0.15 mm thick plastic sheet (PES film, product of SUMITOMO BAKELITE CO. LTD.) was employed as the base, and the annealing temperature was changed to 130° C., forming an annealed film on the plastic sheet.

The formed film resulting from annealing was analyzed for X-ray diffraction intensity, and a diffraction peak was observed at $2\theta=25.260$. Investigation of the contact angle of the annealed film revealed that it was 2.5°, confirming the highly hydrophilic property of the annealed surface.

From these results, it was established that the amorphous titanium oxide was converted into a photo-catalyst by annealing.

The refractive index of the obtained photo-catalytic film of titanium oxide was 2.5.

Example 3

The example 2 was repeated except that the annealing temperature was changed to 180° C. and the annealing time was set at 5 minutes, yielding an photo-catalytic film of titanium oxide. The result was similar to that of the example 2.

Example 4

The example 2 was repeated except that the annealing temperature was changed to 50° C. and the annealing time was set at 120 minutes, yielding an photo-catalytic film of titanium oxide. The result was similar to that of the example 2.

Example 5

In this example, a production method of photo-catalytic base material including a light-transmitting electro-conductive film and a photo-catalytic film formed on a light-transmitting plastic resin base is illustrated.

A 188-$\mu$m-thick ARTON film was cleansed by water washing and maintained at 130° C., on which an ITO film was formed with a thickness of 72 nm by the RF sputtering method, and the a film of amorphous titanium oxide ($TiO_2$) with a thickness of 200 nm was formed on it. The processed film was maintained at 150° C. in an annealing apparatus shown in FIG. 1, introducing highly purified nitrogen gas with 3% hydrogen gas (Flow rate: 1 L/min under the atmospheric pressure). Then UV light (wavelength: 172 nm, Intensity: 10 mW/cm$^2$) was applied on the glass plate for 10 minutes using an excimer lamp (product of Ushio Electric Co. Ltd.). The refractive index of titanium oxide after annealing was 2.5, and the refractive index of the formed ITO film was 1.9.

The current-voltage characteristics were studied on a film of titanium oxide before and after annealing with use of UV light (1 KW Hg—Xe lamp, 365 nm, 50 mW/cm$^2$) irradiation. The result was similar to FIG. 2.

The formed film was analyzed for X-ray diffraction intensity, and a diffraction peaks was observed at $2\theta=25.260$, confirming a change of the crystal structure to anatase-type.

The method of a forming a photo-catalytic film of titanium oxide according to the present invention allows a very low temperature for the heated annealing compared with the existing methods which require high temperatures of about 1,000° C. for annealing at formation of photo-catalytic film of crystalline titanium oxide by laser beam irradiation. Application of UV light on the whole surface of the film is feasible with an ordinary UV light irradiation apparatus, and the scanning of laser beam spot is not needed. Therefore, it is possible to obtain a photo-catalytic film of titanium oxide within a shorter time than the existing methods, dispensing with a large-scale treatment apparatus. As a result, the production cost is significantly reduced.

While in the existing methods a specific process or an apparatus is needed for forming a photo-catalytic film on a plastic base material as described heretofore, the present invention facilitates production of a photo-catalytic film on a plastic base material with a simple process or an apparatus.

Also in a complicated process according to the existing methods for applying anti-clouding, anti-pollution, or hydrophilic treatment on a mirror or a glass surface, an amorphous photo-catalytic film is first formed on the surface followed by sintering at more than 400° C. In contrast, the method according to the present invention allows easy production of a photo-catalytic film on a plastic base material. Pasting such a processed base on a surface that needs anti-clouding, anti-pollution or hydrophilic property leads most simply to desired surface properties of the surface.

The entire disclosure of Japanese Patent Application No. 2001-196562 filed on Jun. 28, 2001 including specification, claims, drawings and abstract is incorporated herein by reference in its entirety.

What is claimed is:

1. A method of forming a photo-catalytic film on a base material comprising:

providing the base material with a titanium oxide film; and irradiating the titanium oxide film with UV light in vacuum or in an atmosphere of reducing gas at a temperature maintained between 25 and 300° C.

2. A method of forming a photo-catalytic film according to claim 1, wherein the film of titanium oxide before the irradiation is a film of amorphous titanium oxide, and the photo-catalytic film of titanium oxide after the irradiation is a film of anatase titanium oxide.

3. A method of forming a photo-catalytic film according to claim 1, wherein the photo-catalytic film of titanium oxide has oxygen deficiencies.

4. A method of forming a photo-catalytic film according to claim 1, wherein the UV light is applied with an excimer lamp.

5. A method of forming a photo-catalytic film according to claim 1, wherein the maintained temperature ranges between 50 and 250° C.

6. A method of forming a photo-catalytic film according to claim 1, wherein the base material is made of plastic, and the maintained temperature ranges between 50° C. and a heat resistant temperature of the plastic base material.

7. A method of forming a photo-catalytic film according to claim 1, wherein the base material is made of plastic having a heat resistant temperature that ranges between 100 and 230° C.

8. A method of forming a photo-catalytic film according to claim 2, wherein the film of amorphous titanium oxide is formed by a sputtering method.

9. A method of forming a photo-catalytic film according to claim 2, wherein the film of amorphous titanium oxide is formed by an electron beam deposition method.

10. A method of forming a photo-catalytic film according to claim 1, wherein an anti-reflection film is set up between the base material and the titanium oxide film.

11. A method of forming a photo-catalytic film according to claim 10, wherein the anti-reflection film is a mono layer having a refractive index between the refractive index of the base material and the refractive index of the photo-catalytic film of titanium oxide, and an optical thickness of the anti-reflection film, which is defined as a product of the refractive index of the anti-reflection film times its thickness, corresponding to one-fourth of a central wavelength of visible light or an integer multiple of one-fourth of a central wavelength of visible light.

12. A method of forming a photo-catalytic film of titanium oxide on a base material according to claim 10, wherein the anti-reflection film has multi layers, each layer having a refractive index between the refractive index of the base material and the refractive index of the photo-catalytic film of titanium oxide, and optical thickness values of each anti-reflection film, which are defined as a product of the refractive index of each anti-reflection film times its thickness, corresponding to one-fourth of a central wavelength of visible light or an integer multiple of one-fourth of a central wavelength of visible light.

13. A method of forming a photo-catalytic film according to claim 12, wherein the refractive index of the anti-reflection film is between 1.5 and 2.3.

14. A method of forming a photo-catalytic film according to claim 13, wherein the anti-reflection film is made of metal oxide.

15. A method of forming a photo-catalytic film according to claim 14, wherein the anti-reflection film is made of zirconium oxide.

16. A method of forming a photo-catalytic film according to claim 14, wherein the anti-reflection film is made of indium tin oxide.

17. A method of forming a photo-catalytic film according to claim 16, wherein a thickness of the anti-reflection film is between 50 nm and 100 nm.

18. A method of forming a photo-catalytic film according to claim 1, wherein the photo-catalytic film has an optical thickness value, which is defined as a product of a refractive index of the photo-catalytic film times its thickness, corresponding to one-half of a central wavelength of visible light or an integer multiple of one-half of a central wavelength of visible light.

19. A method of forming a photo-catalytic film according to claim 18, wherein the thickness of the photo-catalytic film is between 70 nm and 150 nm.

* * * * *